United States Patent
Lin

(10) Patent No.: US 7,696,509 B2
(45) Date of Patent: Apr. 13, 2010

(54) SOLID STATE ELECTROLYTE MEMORY DEVICE AND METHOD OF FABRICATING THE SAME

(75) Inventor: Cha-Hsin Lin, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 317 days.

(21) Appl. No.: 11/942,730

(22) Filed: Nov. 20, 2007

(65) Prior Publication Data

US 2009/0026438 A1    Jan. 29, 2009

(30) Foreign Application Priority Data

Jul. 26, 2007    (TW) .............................. 96127233 A

(51) Int. Cl.
*H01L 47/00* (2006.01)
(52) U.S. Cl. .......... 257/4; 257/42; 257/3; 257/E45.002; 438/102
(58) Field of Classification Search ............... 257/4, 257/42, 3, E45.002; 438/102
See application file for complete search history.

(56) References Cited

U.S. PATENT DOCUMENTS

| 6,806,511 | B2 | 10/2004 | Armgarth et al. |
| 7,012,306 | B2 | 3/2006 | Armgarth et al. |
| 7,423,282 | B2 * | 9/2008 | Park et al. ...................... 257/3 |

* cited by examiner

*Primary Examiner*—Tu-Tu V Ho
(74) *Attorney, Agent, or Firm*—Jianq Chyun IP Office

(57) ABSTRACT

A method of fabricating a solid state electrolytes memory device is provided. An insulator layer is formed on a substrate. A conductive layer is formed on the insulator layer. At least two openings partially overlapped and capable of communicating with each other are formed in the conductive layer, so that the conductive layer forms at least a pair of tip electrodes. Thereafter, solid state electrolytes are filled in the openings.

19 Claims, 7 Drawing Sheets

US 7,696,509 B2

SOLID STATE ELECTROLYTE MEMORY DEVICE AND METHOD OF FABRICATING THE SAME

CROSS-REFERENCE TO RELATED APPLICATION

This application claims the priority benefit of Taiwan application serial no. 96127233, filed on Jul. 26, 2007. All disclosure of the Taiwan application is incorporated herein by reference.

BACKGROUND OF THE INVENTION

1. Field of the Invention

The present invention relates to a memory device and a method of fabricating the same. More particularly, the present invention relates to a solid state electrolyte memory device and a method of fabricating the same.

2. Description of Related Art

The demands for non-volatile memories have been dramatically grown since 1999, that is because, considerable wide applications continuously appear in the recent years, for example, portable disks, digital camera memory cards, cell phone memories, so a novel market that cannot be covered by any of the technologies is created.

The current non-volatile memory product is flash memory. However, the architecture of the current flash memory elements has gradually faced the challenge of physical limitations after the 65 nm technology era. Moreover, the flash memory also faces challenges from various characteristic limitations, for example, low operation speed and short operation cycles, so its application is greatly limited. Accordingly, many technologies have been widely researched and discussed. However, there are many potential worries about these technologies, for example, the potential of size keep reducing, excessively high power consumption during switching, etc. Therefore, it is required to further develop and update a memory technology having a deep potentials and capable of meeting the vast memory requirements in the future.

One of the memory devices that have been extensively researched currently is resistance random access memory (RRAM), which uses transition metal oxides as resistance converting materials. However, the mechanism for the resistance changes of the transition metal oxides remains uncertain till now. Many research institutes set forth various different theories to explain the changes in the transition metal oxides, for example, a filamentary current path theory, an oxygen deficiency rearrangement theory. As the mechanism is till unclear, the feature problems of the RRAM elements, such as endurance, cannot be effectively solved. For example, some literatures show that the $Cu_xO$ RRAM can only be operated for about 600 cycles.

On the other aspect, some people researches solid state electrolyte memory, which has desirable endurance performance. In the research of Ag-containing GeSe material in the Solid-state Laboratory, University of Arizona, USA, the test has already been performed for $10^{10}$ cycles. Therefore, this new technology deserves deep research.

SUMMARY OF THE INVENTION

Accordingly, the present invention provides a solid state electrolyte memory, which is capable of effectively controlling the oxidation-reduction reaction of metal ions in the solid state electrolyte, so as to generate conductive channels.

The present invention provides a method of fabricating a solid state electrolyte memory device. The method includes the following steps: forming an insulator layer on a substrate; forming a conductive layer on the insulator layer; forming at least two openings partially overlapped and capable of communicating with each other in the conductive layer, so that the conductive layer forms a pair of self-aligned tip electrodes; and filling a solid state electrolyte in the openings.

The present invention provides a solid state electrolyte memory device, including a substrate, an insulator layer, a conductive layer, and a solid state electrolyte. The insulator layer is located on the substrate. The conductive layer is located on the insulator layer, and has at least two partially-overlapped openings therein, so as to form at least one pair of tip electrodes. The solid state electrolyte is located in the openings of the conductive layer. The insulator layer, the conductive layer, and the solid state electrolyte constitute a first layer of memory unit.

In order to make the aforementioned and other objects, features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
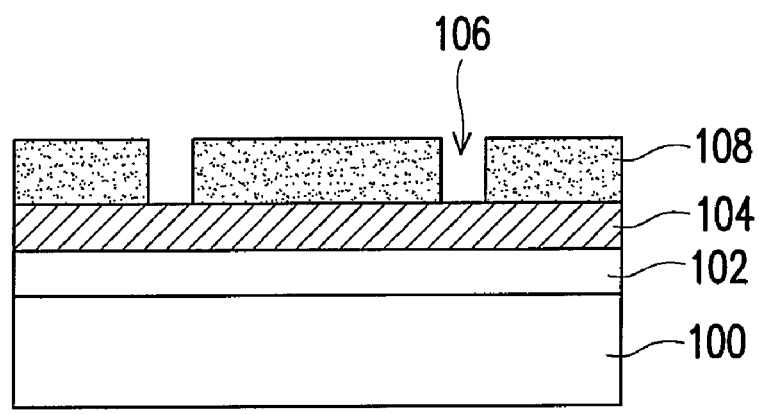
FIGS. 1A to 1C are schematic cross-sectional views of a flow for manufacturing a solid state electrolyte memory device according to an embodiment of the present invention.
Figure 1B:
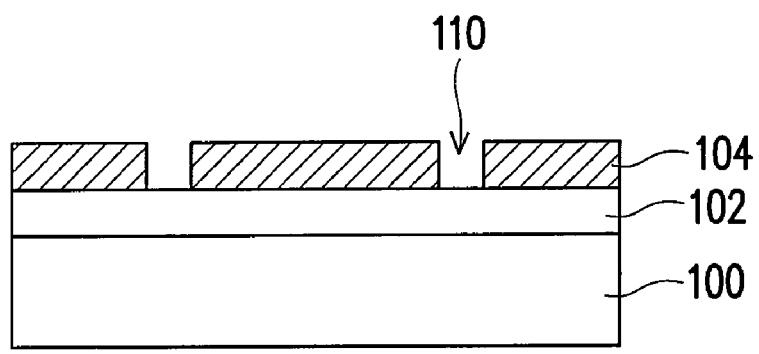
Figure 1C:
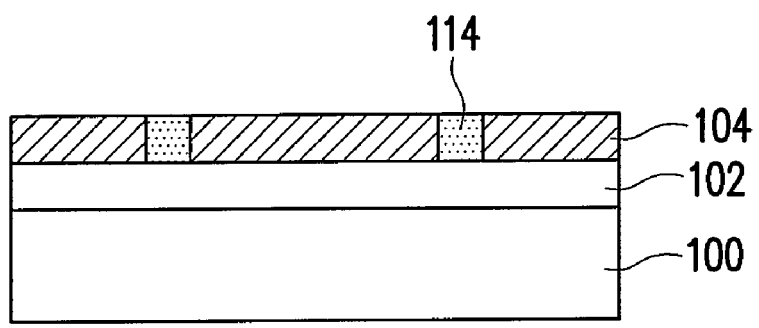
Figure 2A:
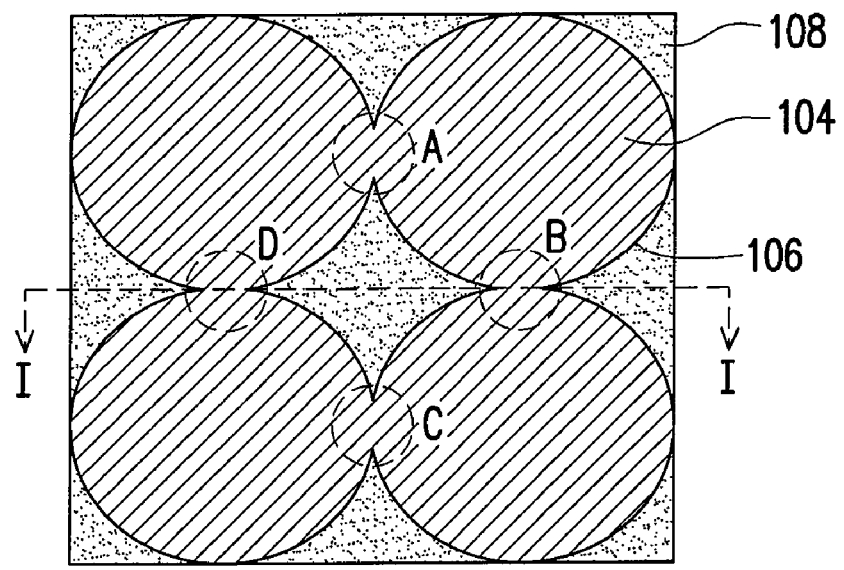
FIGS. 2A to 2C are top views of the flow for manufacturing the solid state electrolyte memory device in FIGS. 1A to 1C.
Figure 2B:
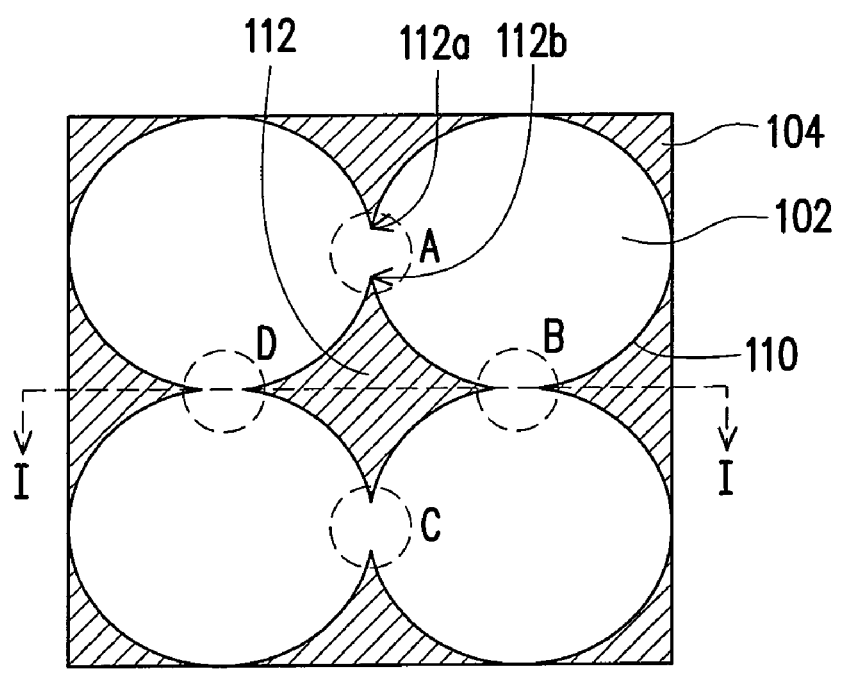
Figure 2C:
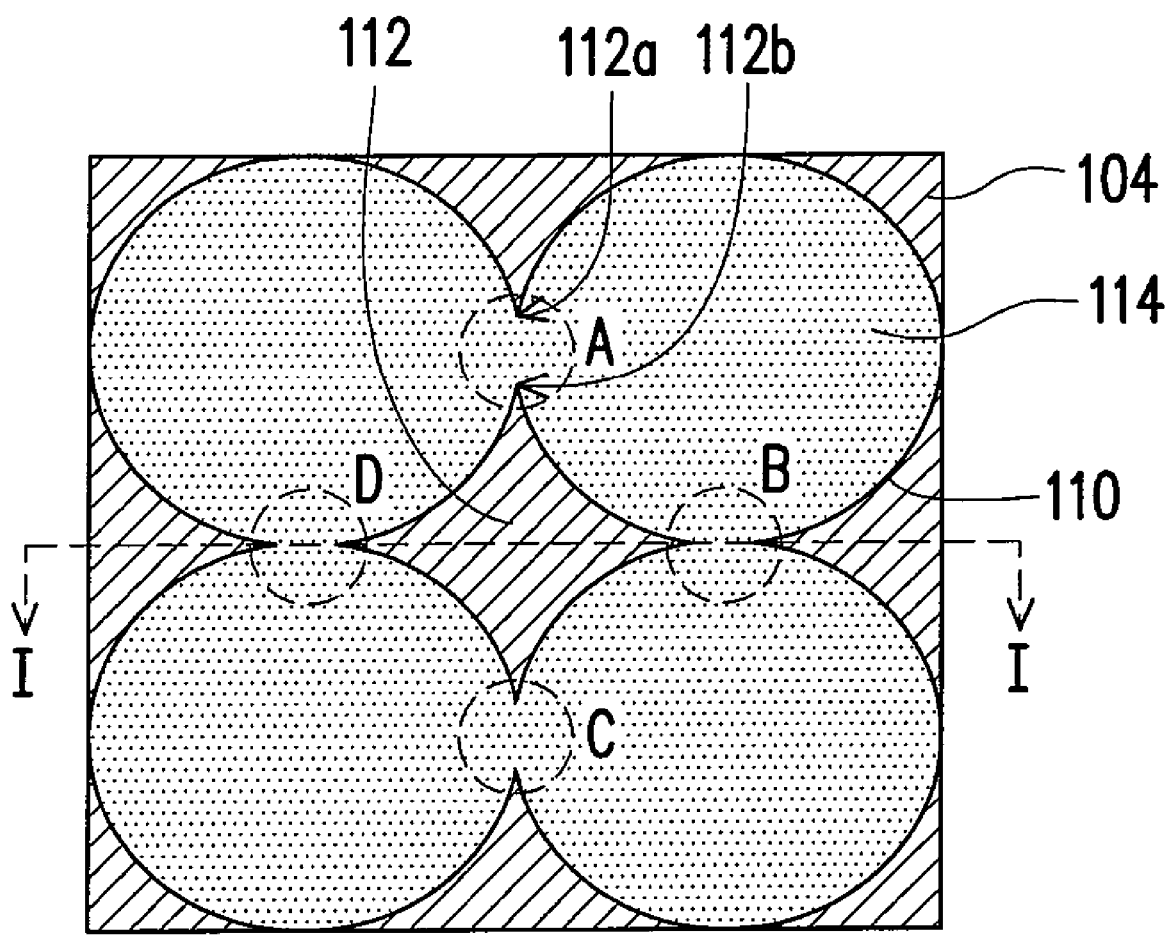
Figure 3A:
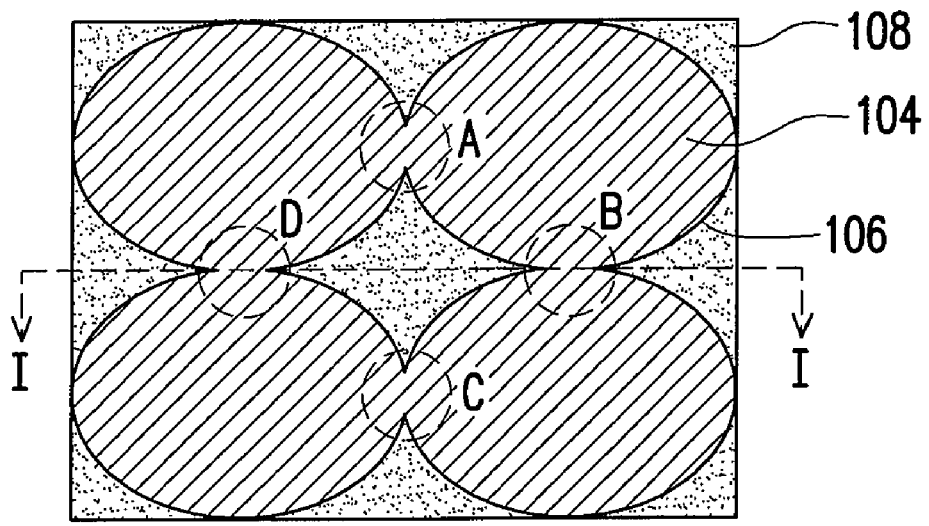
FIGS. 3A to 3C are top views of a flow for manufacturing another solid state electrolyte memory device in FIGS. 1A to 1C.
Figure 3B:
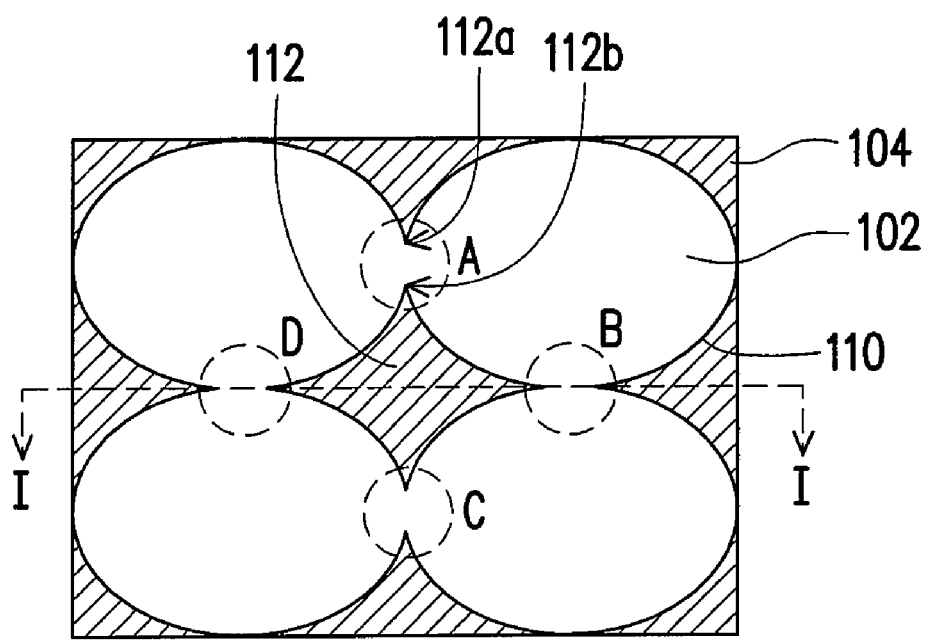
Figure 3C:
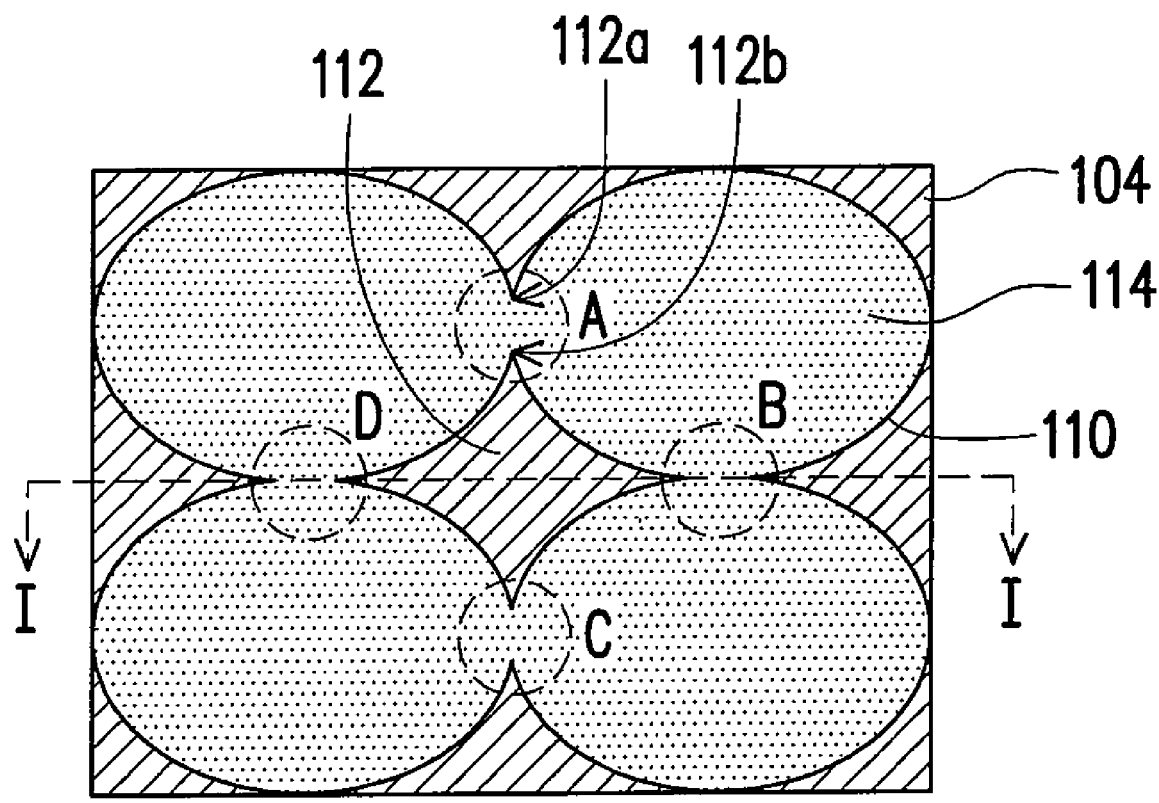
Figure 4A:
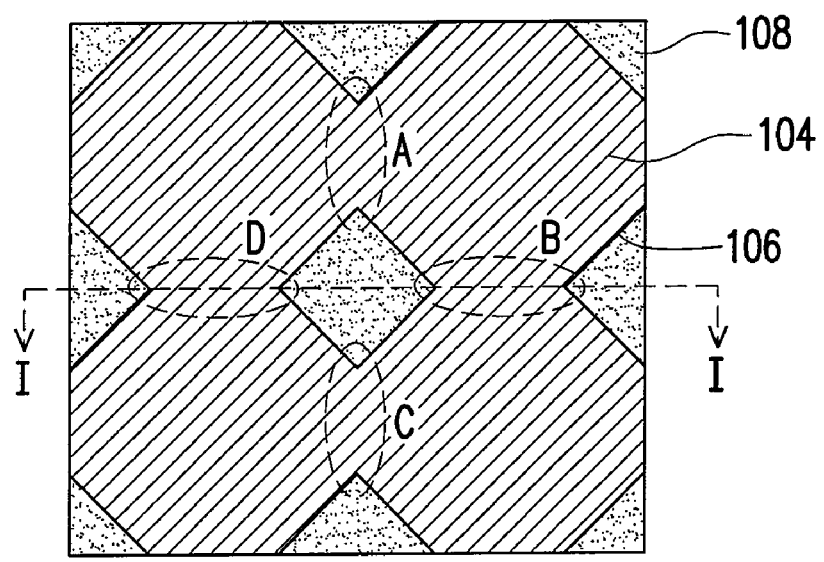
FIGS. 4A to 4C are top views of the flow for manufacturing another solid state electrolyte memory device in FIGS. 1A to 1C.
Figure 4B:
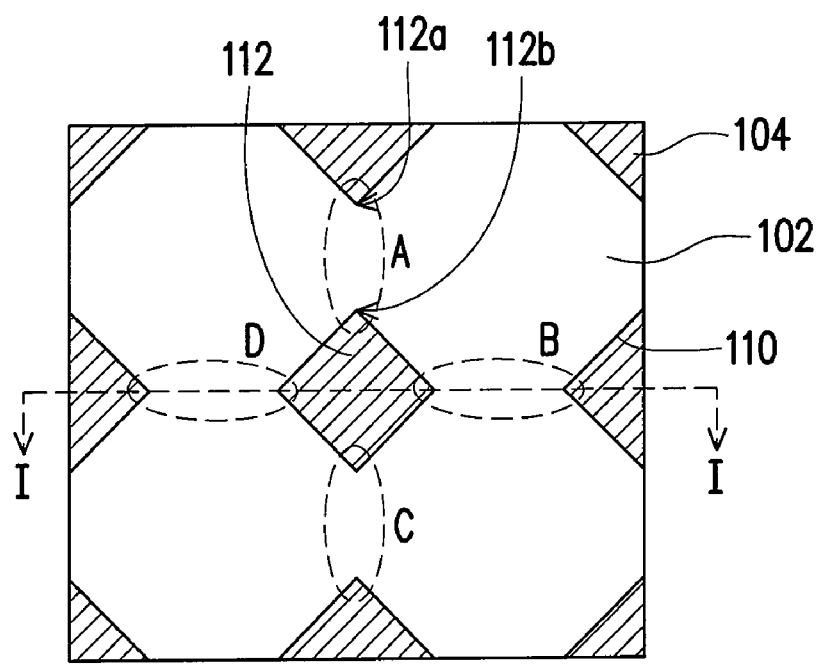
Figure 4C:
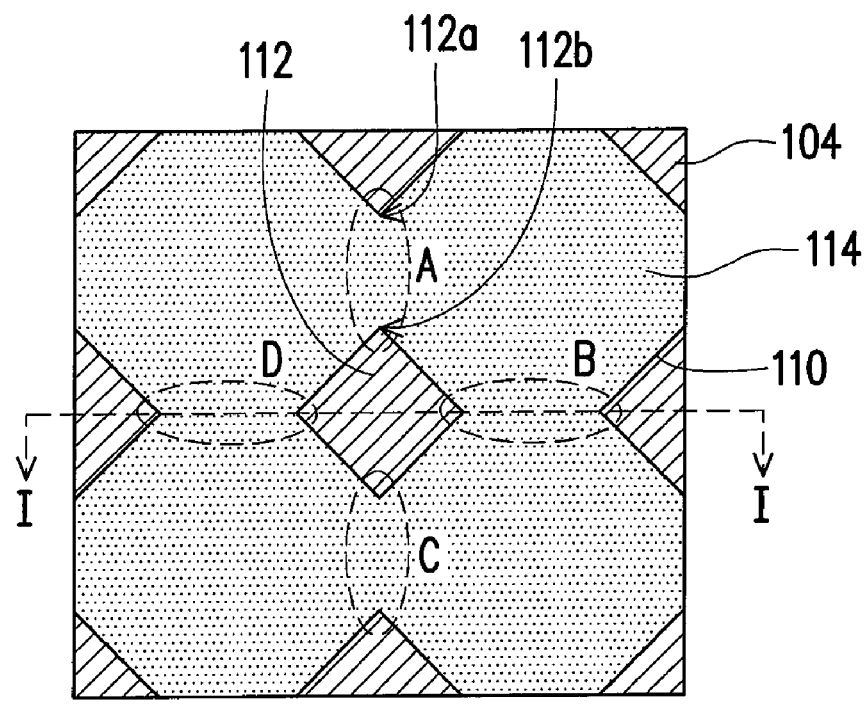

FIGS. 1A to 1C are schematic cross-sectional views of a flow for manufacturing a solid state electrolyte memory device according to an embodiment of the present invention. FIGS. 2A to 2C are top views of the flow for manufacturing the solid state electrolyte memory device in FIGS. 1A to 1C. FIGS. 3A to 3C are top views of a flow for manufacturing another solid state electrolyte memory device in FIGS. 1A to 1C. FIGS. 4A to 4C are top views of the flow for manufacturing another solid state electrolyte memory device in FIGS. 1A to 1C.

Referring to FIGS. 1A and 2A, an insulator layer 102 is formed on a substrate 100. The substrate 100 is, for example, a semiconductor substrate, such as silicon substrate, a semiconductor compound substrate, such as silicon-germanium substrate or silicon-on-insulator substrate (SOI). The insulator layer 102 is made of, for example, silicon oxide, fluorine-doped glass (FSG), borophosphosilicate glass (BPSG), phosphosilicate glass (PSG), silicon nitride, or silicon-oxy-nitride. The process of forming the insulator layer 102 is, for example, chemical vapor deposition (CVD). Next, a conductive layer 104 is formed on the insulator layer 102. The material of the conductive layer 104 comprises metal, for example, the one selected from a group consisting of silver, gold, platinum, copper, tungsten, nickel, titanium nitride, and any combination thereof. The process of forming the conductive layer 104 is, for example, sputtering, evaporation, or CVD process.

Afterwards, a photoresist layer 108 having a pattern of a plurality of openings 106 is formed on the conductive layer 104. Among the openings 106, each two neighboring openings 106 are overlapped and capable of communicating with each other, such that the photoresist layer 108 has a plurality of pairs of tips. The openings 106 can have the same shape, for example, round, ellipse, or polygon. However, each opening may also have a different shape.

In an embodiment, referring to FIG. 2A, in a unit area, there are four round openings 106, and each two of them are partially overlapped and capable of communicating with each other, such that the left photoresist layer 108 has four pairs of tips, as indicated by A, B, C, and D in the figure.

In another embodiment, referring to FIG. 3A, in a unit area, there are four elliptical openings 106, and each two of them are partially overlapped and capable of communicating with each other, such that the photoresist layer 108 has four pairs of tips, as indicated by A, B, C, and D in the figure.

In another embodiment, referring to FIG. 4A, in a unit area, there are four polygon-shaped openings 106, which are, for example, but not limited to, pentagon, hexagon, . . . , hexadecagon-shaped openings. The openings 106 are, for example, represented by octagon-shaped openings 106 in the figure, but the present invention is not limited thereby, and each two of them are partially overlapped and capable of communicating with each other, such that the photoresist layer 108 has four pairs of tips, as indicated by A, B, C, and D in the figure.

Referring to FIGS. 1B, 2B, 3B, and 4B, the conductive layer 104 exposed by the openings 106 is etched with the photoresist layer 108 as mask, such that the pattern of the openings 106 is transferred to the conductive layer 104, so as to form a plurality of openings 110 in the conductive layer 104 and to expose the insulator layer 102. Similarly, each two of the plurality of openings 110 in the conductive layer 104 are also partially overlapped and capable of communicating with each other. Furthermore, the conductive layer 104 at the communication site for the openings 110 respectively forms two self-aligned tip electrodes 112a and 112b. In an embodiment, in a unit area of the conductive layer 104, there are four openings 110, and each two of them are partially overlapped and capable of communicating with each other, a common electrode 112 with four tips 112b is formed at the center of a unit area, and tip electrodes 112a self-aligned with the four tips 112 of the common electrode 112 are formed at the communication site for the openings 110. Thereafter, the photoresist layer 108 is removed.

Afterward, referring to FIGS. 1C, 2C, 3C, and 4C, a solid state electrolyte 114 is filled in the openings 110 of the conductive layer 104. The solid state electrolyte 114 is, for example, germanium selenide (GeSe), germanium sulphide (GeS), AgTeSe, AgTeS, or AgSeS doped with silver, copper, chromium, or niobium. The process of filling the solid state electrolyte 114 is, for example, sputtering, ink jet printing, or evaporation. In an embodiment, in a unit area of the conductive layer 104, there are four openings 110. The four tips 112b of the common electrode 112 at the center of the conductive layer 104, self-aligned tip electrodes 112a, and the solid state electrolyte 114 filled there-between constitute a memory device with four storage points, that is to say, one bit can be respectively stored at A, B, C, and D.

Figure 5:
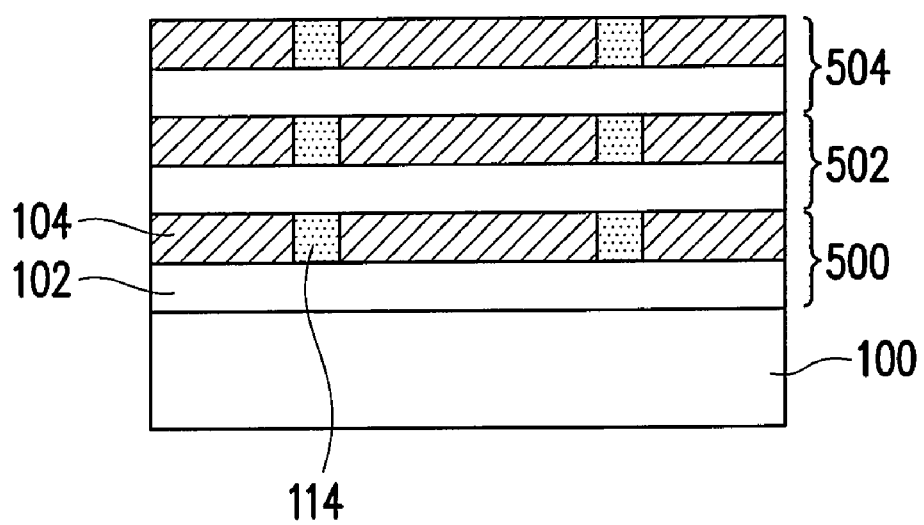
FIG. 5 is a schematic view of a solid state electrolyte memory device of a multi-layered memory unit according to an embodiment of the present invention.

Referring to FIG. 5, a first layer of memory unit 500 can be formed on the substrate 100 after the steps of forming the insulator layer 102, forming the patterned conductive layer 104 and filling solid state electrolyte 114 are finished. In practical application, the steps of forming the insulator layer 102, forming the patterned conductive layer 104, and filling the solid state electrolyte 114 can be repeatedly performed, so as to form a second layer of memory unit 502 on the first layer of memory unit 500, or even more layers of memory units 504.

Generally, the solid state electrolyte requires a strong electric field or a large current to generate metal cluster arrangement within the electrolyte. The tip electrode can generate a very high electric field in a narrow partial region within the solid state electrolyte, such that electrolyte form metal clusters and the oxidation-reduction reaction occurs for the metal ions, so as to generate conductive channels in the solid state electrolyte, and as a result, the resistance of the memory material is changed for 1,000,000 times, thereby achieving the objective of storing data. Therefore, the solid state electrolytes memory device of the present invention consumes relatively low power during switching.

Furthermore, besides the electrodes on two sides of the solid state electrolyte are all tip electrodes, they are further "self-aligned", such that the region where the metal cluster is formed can be further controlled, so the operations of the elements can be effectively controlled.

The solid state electrolytes memory device of the present invention can store multiple bits in a unit area, for example, four bits, so it can satisfy the requirements of a vast memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a solid state electrolytes memory device, comprising:
    forming an insulator layer on a substrate;
    forming a conductive layer on the insulator layer;
    forming at least two openings partially overlapped and capable of communicating with each other in the conductive layer, so that the conductive layer forms at least one pair of tip electrodes; and
    filling a solid state electrolyte in the openings.

2. The method of fabricating the solid state electrolytes memory device as claimed in claim 1, wherein the openings have the same shape.

3. The method of fabricating the solid state electrolytes memory device as claimed in claim 1, wherein the shape of openings is selected from a group consisting of round, ellipse, polygon, and any combination thereof.

4. The method of fabricating the solid state electrolytes memory device as claimed in claim 1, wherein the conductive layer has four openings formed herein, and each two of the four openings are partially overlapped and capable of communicating with each other, such that the conductive layer forms a common electrode with four tips and four tip electrodes self-aligned with the four tips of the common electrode, so as to constitute a memory device with four storage points.

5. The method of fabricating the solid state electrolytes memory device as claimed in claim 1, wherein the material of the insulator layer comprises silicon oxide, fluorine-doped glass, borophosphosilicate glass, phosphosilicate glass, silicon nitride, or silicon-oxy-nitride.

6. The method of fabricating the solid state electrolytes memory device as claimed in claim 1, wherein the solid state electrolyte comprises germanium selenide (GeSe), germanium sulphide (GeS), AgTeSe, AgTeS, or AgSeS doped with silver, copper, chromium, or niobium.

7. The method of fabricating the solid state electrolytes memory device as claimed in claim 1, wherein the material of the conductive layer comprises metal.

8. The method of fabricating the solid state electrolytes memory device as claimed in claim 7, wherein the metal is selected from a group consisting of silver, gold, platinum, copper, tungsten, nickel, titanium nitride, and any combination thereof.

9. The method of fabricating the solid state electrolytes memory device as claimed in claim 1, wherein the process of forming at least two openings partially overlapped and capable of communicating with each other in the conductive layer comprises:

forming a photoresist layer having a pattern of at least two openings partially overlapped and capable of communicating with each other on the conductive layer;

etching the conductive layer with the photoresist layer as mask, to form at least two openings partially overlapped and capable of communicating with each other in the conductive layer; and removing the photoresist layer.

10. The method of fabricating the solid state electrolytes memory device as claimed in claim 1, wherein the at least one pair of tip electrodes is a pair of self-aligned tip electrodes.

11. A solid state electrolytes memory device, comprising:
    an insulator layer, located on a substrate;
    a conductive layer, located on the insulator layer, and having at least two partially overlapped openings therein to form at least one pair of tip electrodes; and
    a solid state electrolyte, located in the openings of the conductive layer;
    wherein the insulator layer, the conductive layer, and the solid state electrolyte constitute a first layer of memory unit.

12. The solid state electrolytes memory device as claimed in claim 11, wherein the openings have the same shape.

13. The solid state electrolytes memory device as claimed in claim 11, wherein the shape of openings is selected from a group consisting of round, ellipse, polygon, and any combination thereof.

14. The solid state electrolytes memory device as claimed in claim 11, wherein the conductive layer has four openings and each two of the four openings are partially overlapped with each other, such that the conductive layer forms a common electrode with four tips and four tip electrodes self-aligned with the four tips of the common electrode, so as to constitute a memory device having four storage points.

15. The solid state electrolytes memory device as claimed in claim 11, wherein the solid state electrolyte comprises germanium selenide (GeSe), germanium sulphide (GeS), AgTeSe, AgTeS, or AgSeS doped with silver, copper, chromium, or niobium.

16. The solid state electrolytes memory device as claimed in claim 11, wherein the material of the conductive layer comprises metal.

17. The solid state electrolytes memory device as claimed in claim 16, wherein the metal is selected from a group consisting of silver, gold, platinum, copper, tungsten, nickel, titanium nitride, and any combination thereof.

18. The solid state electrolytes memory device as claimed in claim 11, further comprising at least one second layer of memory unit located on the first layer of memory unit.

19. The solid state electrolytes memory device as claimed in claim 11, wherein the at least one pair of tip electrodes is a pair of self-aligned tip electrodes.

* * * * *